United States Patent [19]
Akutsu et al.

[11] Patent Number: 6,117,487
[45] Date of Patent: Sep. 12, 2000

[54] PROCESS FOR FORMING METAL OXIDE FILM BY MEANS OF CVD SYSTEM

[75] Inventors: Mitsuo Akutsu; Naohiro Kubota; Akifumi Masuko; Naoki Yamada, all of Tokyo, Japan

[73] Assignee: Asahi Denka Kogyo Kabushiki Kaisha, Tokyo, Japan

[21] Appl. No.: 09/275,408

[22] Filed: Mar. 24, 1999

Related U.S. Application Data

[63] Continuation-in-part of application No. 09/053,754, Apr. 2, 1998, abandoned.

[51] Int. Cl.[7] .............................. C23C 16/00; H05H 1/24; C07F 7/28
[52] U.S. Cl. ......................... 427/255.3; 556/54; 556/81; 427/255.5; 427/255.6; 427/576; 427/581; 427/584; 427/587; 427/593
[58] Field of Search ................... 556/54, 81; 427/255.3, 427/255.5, 255.6, 587, 576, 581, 584, 593

[56] References Cited

U.S. PATENT DOCUMENTS

| | | | |
|---|---|---|---|
| 3,650,815 | 3/1972 | Ghoshtagore et al. | 117/106 |
| 3,856,839 | 12/1974 | Smith et al. | 260/429.5 |
| 5,124,180 | 6/1992 | Proscia | 427/255.3 |
| 5,389,401 | 2/1995 | Gordon | 427/255.2 |
| 5,527,567 | 6/1996 | Desu et al. | 427/573 |
| 5,618,575 | 4/1997 | Peter | 427/8 |

FOREIGN PATENT DOCUMENTS

| | | |
|---|---|---|
| 5-98444 | 4/1993 | Japan . |
| 5-132776 | 5/1993 | Japan . |
| 5-271253 | 10/1993 | Japan . |

*Primary Examiner*—Porfirio Nazario-Gonzalez
*Attorney, Agent, or Firm*—Young & Thompson

[57] ABSTRACT

A process for forming a metal oxide film by means of a chemical vapor deposition system, which comprises using a complex of a β-diketone compound and a group IV metal glycolate, the complex being represented by formula (I):

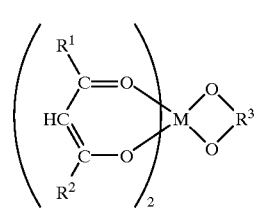

wherein M represents a metal atom of the group IV; $R^1$ and $R^2$ each represent a branched alkyl or cycloalkyl group having 4 to 8 carbon atoms; and $R^3$ represents a straight-chain or branched alkylene group having 2 to 18 carbon atoms.

5 Claims, 1 Drawing Sheet

PROCESS FOR FORMING METAL OXIDE FILM BY MEANS OF CVD SYSTEM

This is a continuation-in-part application of U.S. application Ser. No. 09/053,745, filed on Apr. 2, 1998, now abandoned.

BACKGROUND OF THE INVENTION

1. Field of the Invention

This invention relates to a process for forming a metal oxide film by means of a CVD system using a complex of a β-diketone compound and a group IV metal glycolate.

2. Description of the Related Art

Complexes of metals of the group IV such as titanium, lead and zirconium are of importance as a material for forming a metal oxide thin film by chemical vapor deposition (hereinafter referred to as a CVD material). In particular, complexes metals of the group IV with β-diketone compounds are known to be highly useful because of their high vapor pressure and high oxidation reactivity.

However, the metal complex of dipivaloylmethane (a β-diketone compound), which is a typical CVD material, is labile per se and ready to decompose on reacting with moisture or carbon dioxide in air or oligomerize to change its vaporization characteristics. Japanese Patent Application Laid-Open No. 132776/93 proposes adding a nucleophilic organic substance, such as tetrahydrofuran or a glyme, to these metal complexes. Further, Japanese Patent Application Laid-Open No. 98444/93 teaches addition of an o-phenanthroline derivative or a crown ether to the metal complex for obtaining more stable complexes. However, these proposed complex adducts release the added moiety when exposed to high temperatures and come to have instable vaporization characteristics. A metal complex having satisfactory performance properties as a CVD material in practice has not been obtained yet.

It has therefore been desired to develop a chelating compound which does not require a complex stabilizer such as the above-described nucleophilic organic substance.

Japanese Patent Application Laid-Open No. 271253/93 discloses an alcoholatotitanium complex composed of 2 moles of dipivaloylmethane and 2 moles of a monohydric alcohol. This complex has a low evaporating temperature and exhibits satisfactory volatility and oxidation reactivity. Further, the complex can be synthesized with high purity.

Where a complex metal oxide film is formed by CVD, the CVD material of the group IV metal is used as a mixture with other metal complexes, such as complexes of barium, strontium or zirconium. Therefore, it is desired for the metal complex compound to be similar to other CVD materials in vaporization characteristics and oxidation decomposability and to have low reactivity to the other CVD materials so as not to change its own vaporization characteristics when mixed with other CVD materials.

In this respect, because the above-mentioned alcoholatotitanium complex has reactive monovalent alkoxide groups, it has high reactivity with other metal complexes in CVD thin film formation. The reaction product, which may be produced, differs from each metal complex before the reaction in vaporization characteristics or oxidation decomposability, which has made it difficult to control the composition of the complex metal oxide film.

Besides, in controlling the vaporization characteristics it is not favorable to control the vaporizing temperature by increasing the molecular weight of the metal complex, because such means a decrease in content of the metal as an active component.

SUMMARY OF THE INVENTION

Accordingly, an object of the present invention is to provide a process for forming a metal oxide film by means of a CVD system using a metal complex compound useful as a CVD material which has low reactivity with other CVD materials so that the vaporization characteristics thereof may not undergo change when used as a mixture with other CVD materials.

In the light of the above object, the inventors of the present invention have conducted extensive investigation and, as a result, it has been found that a specific complex of a β-diketone compound and a glycolate of a metal of the group IV is less reactive with other CVD materials than a complex of a β-diketone compound and an alcoholate of the group IV metal owing to the effect of glycolate's shielding the metal element and that the vaporizing temperature of this complex is controllable through selection of the structure of the glycol without altering the molecular weight.

The present invention has been completed based on these findings. The present invention provides a process for forming a metal oxide film by means of a CVD (chemical vapor deposition) system, which comprises using a complex of a β-diketone compound and a group IV metal glycolate, the complex being represented by formula (I):

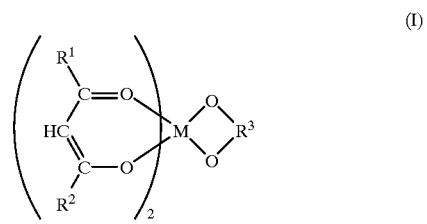

wherein M represents a metal atom of the group IV; $R^1$ and $R^2$ each represent a branched alkyl or cycloalkyl group having 4 to 8 carbon atoms; and $R^3$ represents a straight-chain or branched alkylene group having 2 to 18 carbon atoms.

The complex of β-diketone compound and a glycolate of the group IV metal used in the present invention is useful as a CVD material suited for multi-component film formation.

DETAILED DESCRIPTION OF THE INVENTION

Figure 1:
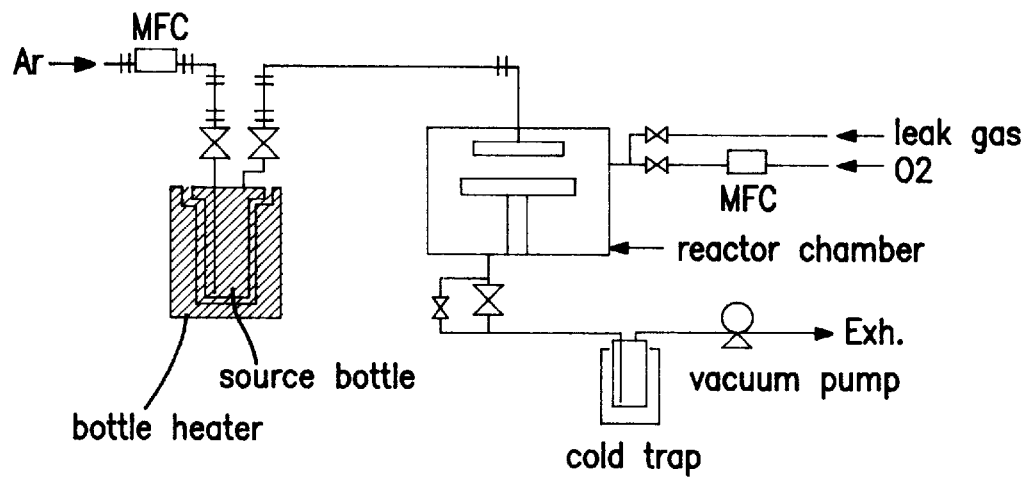
FIG. 1 is a schematic view showing a CVD apparatus used in Examples 1 and 2 described below.

The process for forming a metal oxide film by means of a CVD system according to the present invention will be described in detail.

Regarding the complex of a β-diketone compound and a glycolate of the group IV metal (hereinafter simply referred to as a complex compound) used in the present invention, in formula (I), the branched alkyl group having 4 to 8 carbon atoms as represented by $R^1$ and $R^2$ includes isobutyl, sec-butyl, tert-butyl, isopentyl, sec-pentyl, tert-pentyl, isohexyl, sec-hexyl, tert-hexyl, isoheptyl, isooctyl, sec-octyl, tert-octyl, and 2-ethylhexyl groups; and the cycloalkyl group includes a cyclohexyl group.

The straight-chain or branched alkylene group having 2 to 18 carbon atoms as $R^3$ is a group derived from a glycol (diol). The glycol includes ethanediol, 1,2-propanediol, 1,3-propanediol, 1,3-dimethyl-1,3-propanediol, 2,2-dimethyl-1,3-propanediol, 2-methyl-2-ethyl-1,3-propanediol, 2,2-diethyl-1,3-propanediol, 2-ethyl-2-butyl-1,3-propanediol, 1-methyl-1,3-propanediol, and 2-methyl-1,3-propanediol, with 1,3-propanediol and an alkyl-substituted 1,3-propanediol being preferred for enhancing the effects of the present invention.

The group IV metal atoms as represented by M include titanium, zirconium, lead, and tin.

Specific examples of the complex compounds No. 1 to No. 8 used in the present invention are shown below for illustrative purposes only but not for limitation.

Compound No. 1

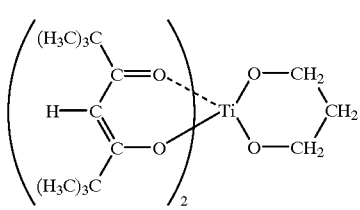

Compound No. 2

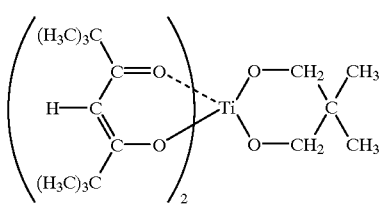

Compound No. 3

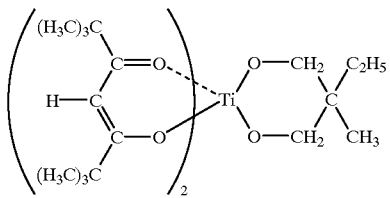

Compound No. 4

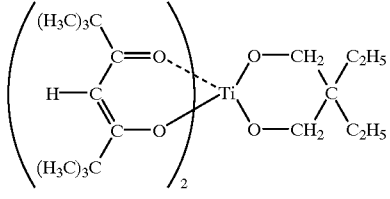

Compound No. 5

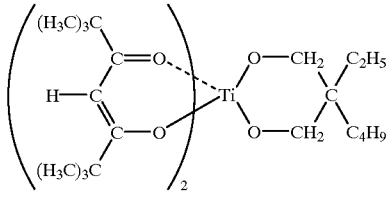

Compound No. 6

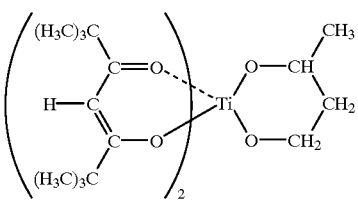

Compound No. 7

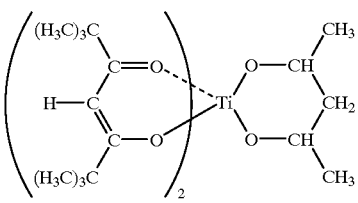

Compound No. 8

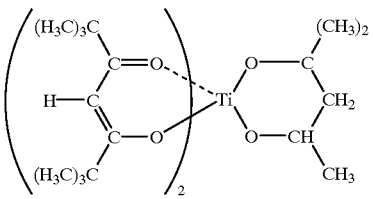

The process for synthesizing the complex compound used in the present invention is not particularly limited. For example, it is obtained by reacting 1 mol of titanium tetraisopropoxide (hereinafter abbreviated as TTIP) and 2 mol of dipivaloylmethane (hereinafter abbreviated as DPM) in an aliphatic hydrocarbon solvent under reflux while releasing isopropyl alcohol and adding 1 mol of 1,3-propanediol for further reaction.

Any method generally applied to a CVD system is adopted with no particular restriction to metal oxide film formation by CVD using the complex of a β-diketone compound and a glycolate of a group IV metal according to the present invention. For example, a CVD material delivery system includes a bubbling system, a solution system, etc., and a film formation method includes a thermal CVD system, a plasma enhanced CVD system, and a photo-assisted CVD system.

While not limiting, the organic solvents which can be used for the solution system include alcohols, such as methanol, ethanol, 2-propanol, and n-butanol; acetic esters, such as ethyl acetate, butyl acetate and methoxyethyl acetate; ether alcohols, such as ethyleneglycol monomethylether, ethyleneglycol monoethylether, ethyleneglycol monobutylether, and diethylene glycol monomethyl ether; ethers, such as tetrahydrofuran, ethyleneglycol dimethylether, diethyleneglycol dimethylether, triethyleneglycol dimethylether, and dibutyl ether; ketones, such as methyl butyl ketone, methyl isobutyl ketone, ethyl butyl ketone, dipropyl ketone, diisobutyl ketone, methyl amyl ketone, cycloliexanone, and methylcyclohexanone; and hydrocarbons, such as hexane, cyclohexane, heptane, octane, toluene, and xylene. A suitable organic solvent is appropriately selected in accordance with the solubility of the solute, the relation among the working temperature, the boiling point, and the flash point, the characteristics of the metal oxide film formed, and the like.

The composition of the metal oxide film formed by the CVD using the complex of the present invention is not particularly limited and includes, for example, a single metal oxide made up of one kind of the group IV metal, a complex metal oxide comprising two or more kinds of the group IV metals, and a complex metal oxide comprising the group IV metal and one or more kinds of other metals. The single metal oxide includes titanium oxide, zirconium oxide, and tin oxide. The complex metal oxide comprising two or more IV group metals includes lead titanate, lead zirconate, and lead titanate zirconate. The complex metal oxide comprising the group IV metal and one or more metals of other kinds includes barium titanate, strontium titanate, barium strontium titanate, and lanthanum-added lead titanate zirconate.

Source compounds supplying the metal other than the group IV metals are not particularly limited as long as they are applicable to CVD. Useful compounds include metal alcoholates, metal β-diketonates, alkyl metals, and metallocene compounds. In the formation of a complex metal oxide film, the source compounds may be vaporized either individually or as a mixture of some kinds.

Of the above source compounds supplying the metal other than the group IV metals preferred are β-diketonates which do not undergo such reactions as ligand exchange with the group IV metal complex of the present invention. β-Diketones used to prepare such compounds include those having an ether chain, such as 2,2,6,6-tetramethylheptane-3,5-dione, 6-methylheptane-2,4-dione, 5-methylheptane-2, 4-dione, 2,2,6-trimethyloctane-3,5-dione, 2,6-dimethyloctane-3,5-dione, 1-(2-methoxyethoxy)-2,2,6,6-tetramethylheptane-3,5-dione, and 1-(2-methoxyethoxy)-2, 6,6-trimethylheptane-3,5-dione.

Synthesis Examples of the complex compound used in the present invention will now be illustrated in greater detail, but the present invention should not be construed as being limited thereto.

SYNTHESIS EXAMPLE 1

Synthesis of Compound No. 1

In 1000 ml of xylene, 71 g (0.25 mol) of TTIP and 92 g (0.5 mol) of DPM were refluxed at 60° C. for 2 hours while removing isopropyl alcohol. To the reaction mixture was added 19 g (0.25 mol) of 1,3-propanediol followed by further refluxing at 140° C. for 3 hours while removing isopropyl alcohol. The solvent was evaporated under reduced pressure, and the residue was purified by liquid chromatography (hereinafter abbreviated as LC) to give 120 g (yield: 98%) of a brown glassy solid having a purity of 92%. In differential thermogravimetric analysis (hereinafter abbreviated as DTGA) at a rate of temperature rise of 10° C./min under atmospheric pressure in a nitrogen stream, the glassy solid began to lose its weight at 224° C. (hereinafter referred to as a weight loss initiating temperature). The glassy solid was heat-melted and purified by distillation at 157 to 163° C./1.5 mmHg to obtain 105 g (86%) of a brown glass solid having an LC purity of 100%.

The resulting compound was found to have a titanium content of 9.80%. The compound was identified to be the desired one from the infrared absorption spectrum (IR) analysis results shown below.

The IR spectrum showed absorption peaks at 3448, 3415, 3382, 2960, 2867, 2362, 2329, 1575, 1533, 1502, 1457, 1382, 1355, 1292, 1224, 1174, 1145, 1087, 962, 873, 767, 621, 507, 476, 437, 432 and 408 cm$^{-1}$.

SYNTHESIS EXAMPLE 2

Synthesis of Compound No. 2

In the same manner as in Synthesis Example 1 except for replacing 1,3-propanediol with 26 g (0.25 mol) of 2,2-dimethyl-1,3-propanediol, 126 g (98%) of a brown glassy solid having an LC purity of 93% was obtained. The resulting glassy solid had a weight loss initiating temperature of 247° C. in DTGA under atmospheric pressure in a nitrogen stream. The glassy solid was heat-melted and purified by distillation at 170 to 175° C./1.6 mmHg to give 114 g (88%) of a brown glassy solid having an LC purity of 100%.

The resulting compound had a titanium content of 9.27%. It was identified to be the desired compound from the IR spectrum showing absorption peaks at 3434, 2960, 2871, 2833, 1645, 1577, 1562, 1537, 1504, 1461, 1380, 1357, 1294, 1226, 1174, 1145, 1089, 1016, 968, 873, 796, 690, 649, 626, 578, 511, 441, and 403 cm$^{1}$.

SYNTHESIS EXAMPLE 3

Synthesis of Compound No. 3

In the same manner as in Synthesis Example 1 except for replacing 1,3-propanediol with 29.5 g (0.25 mol) of 2-ethyl-2-methyl-1,3-propanediol, 131 g (99%) of a brown glassy solid having an LC purity of 94% was obtained. The resulting glassy solid had a weight loss initiating temperature of 244° C. in DTGA under atmospheric pressure in a nitrogen stream. The glassy solid was heat-melted and purified by distillation at 162 to 168° C./1.2 mmHg to give 123 g (93%) of a brown glassy solid having an LC purity of 100%.

The resulting compound had a titanium content of 9.02%. It was identified to be the desired compound from the IR spectrum showing absorption peaks at 3482, 3452, 2962, 2873, 2364, 2333, 1575, 1535, 1502, 1457, 1382, 1355, 1294, 1224, 1176, 1145, 1089, 1031, 966, 873, 792, 651, 624, 584, 507, 476, 439, and 406 cm$^{-1}$.

SYNTHESIS EXAMPLE 4

Synthesis of Compound No. 4

In the same manner as in Synthesis Example 1 except for replacing 1,3-propanediol with 33 g (0.25 mol) of 2,2-diethyl-1,3-propanediol, 133 g (98%) of a brown glassy solid having an LC purity of 92% was obtained. The resulting glassy solid had a weight loss initiating temperature of 250° C. in DTGA under atmospheric pressure in a nitrogen stream. The glassy solid was heat-melted and purified by distillation at 172 to 180° C./1.5 mmHg to give 125 g (92%) of a brown glassy solid having an LC purity of 100%.

The resulting compound had a titanium content of 8.79%. It was identified to be the desired zompound from the IR spectrum showing absorption peaks at 3444, 2962, 2929, 2875, 2362, 2333, 1575, 1535, 1502, 1459, 1382, 1355, 1292, 1224, 1174, 1145, 1091, 968, 933, 871, 790, 738, 659, 622, 584, 549, 505, and 472 cm$^{-1}$.

SYNTHESIS EXAMPLE 5

Synthesis of Compound No. 7

In the same manner as in Synthesis Example 1 except for replacing 1,3-propanediol with 26 g (0.25 mol) of 2,4-pentanediol, 126 g (98%) of a pale yellow clear liquid having an LC purity of 96% was obtained. The resulting liquid had a weight loss initiating temperature of 217° C. in DTGA under atmospheric pressure in a nitrogen stream. The liquid was purified by distillation at 130 to 132° C./0.2 mmHg to give 120 g (93%) of a pale yellow clear liquid having an LC purity of 100%.

SYNTHESIS EXAMPLE 6

Synthesis of Compound No. 8

In the same manner as in Synthesis Example 1 except for replacing 1,3-propanediol with 29.5 g (0.25 mol) of 2-methyl-2,4-pentanediol, 130 g (98%) of a colorless clear liquid having an LC purity of 96% was obtained. The resulting liquid had a weight loss initiating temperature of 220° C. in DTGA under atmospheric pressure in a nitrogen stream. The liquid was purified by distillation at 134 to 135° C./0.2 mmHg to give 121 g (91%) of a colorless clear liquid having an LC purity of 100%.

The resulting compound had a titanium content of 8.79%. It was identified to be the desired compound from the IR spectrum showing absorption peaks at 2964, 2927, 2865, 1560 1537, 1502, 1457, 1382, 1357, 1294, 1222, 1147, 1078, 1045, 972, 945, 871, 796, 761, 626, 597, 549, 505, 480, 432, and 410 $cm^{-1}$.

COMPARATIVE SYNTHESIS EXAMPLE

In 1000 ml of hexane, 71 g (0.25 mol) of TTIP and 92 g (0.5 mol) of DPM were refluxed at 60° C. for 2 hours while removing isopropyl alcohol. The reaction product was recrystallized from hexane to give 109 g (82%) of white crystals having an LC purity of 100%. The resulting crystals had a weight loss initiating temperature of 202° C. in DTGA under atmospheric pressure in a nitrogen stream.

The resulting compound was found to have a titanium content of 8.99%. The IR spectrum of the compound showed absorptions at 3741, 3407, 2996, 2925, 2863, 1645, 1592, 1562, 1533, 1500, 1456, 1384, 1357, 1326, 1294, 1226, 1135, 997, 873, 850, 792, 761, 626, 584, 501, 453, and 426 $cm^{-1}$. This compound was designated Comparative Compound 1.

In table 1 below are shown the molecular weight, the weight loss initiating temperature in DTGA under atmospheric pressure, the purification conditions (distilling temperature and pressure), and the appearance of the complex compounds used in the present invention (Compound Nos. 1 to 4, 7, and 8) and Comparative Compound 1.

TABLE 1

| Compound No. | Mol. Wt. | Wt. Loss Initiating Temp. (° C.) | Distilling Conditions Temp. (° C.) | Pressure (mmHg) | Appearance |
|---|---|---|---|---|---|
| 1 | 488 | 224 | 157–161 | 1.5 | solid |
| 2 | 516 | 247 | 170–175 | 1.6 | solid |
| 3 | 530 | 244 | 162–168 | 1.2 | solid |
| 4 | 544 | 250 | 172–180 | 1.5 | solid |
| 7 | 516 | 217 | 130–132 | 0.2 | liquid |
| 8 | 530 | 220 | 134–135 | 0.2 | liquid |
| Comparative Compound 1 | 532 | 202 | — | — | solid |

The stability as a CVD material of the complex compounds used in the present invention (Compound Nos. 2 and 8) and Comparative Compound 1 was evaluated as follows. A toluene solution of a dipivaloylmethanestrontium complex was added to a toluene solution of the test compound to prepare a 1/1 (by mole) mixture. After solvent removal, the mixture was analyzed by differential thermography. The temperature was raised from 30° C. up to 600° C. at a rate of 10° C./min in a nitrogen stream, and the temperature range wherein the sample showed a weight loss and the vaporization residue at 500° C. were measured. The results obtained are shown in Table 2 below. In Table 2, "G" indicates that the mixed complexes displayed a weight loss in two stages in accordance with the respective vaporization characteristics of the two complexes, while "NG" indicates that the complexes underwent reaction to generate a third component so that a weight loss occurred in three stages. A large amount of the vaporization residue at 500° C. means difficulty in controlling the composition of a CVD film.

TABLE 2

| Compound No. | Thermal Stability of Complex Mixture Wt. Loss Temp Range (° C.) | | 500° C. Residue (%) |
|---|---|---|---|
| 2 | 221–277, 277–382 | G | 3.0 |
| 8 | 219–258, 258–382 | G | 2.4 |
| Comparative Compound 1 | 198–265, 265–350, 350–553 | NG | 14 |

As is apparent from the results of Compounds No. 1 vs. No. 7 and Compounds No. 3 vs. No. 8 in Table 1, the complex compounds used in the present invention (β-diketone compound glycolato complex) can have the same molecular weight and different vaporization characteristics by selecting the structure of the glycolato ligand.

As can be seen from the results in Table 2, the complex compound used in the present invention exhibits high thermal stability even when used as a mixture with a different metal complex. Further, it can reach a 100% purity with ease by distillation purification. Therefore, the complex compound of the present invention is a useful CVD material with excellent thermal stability.

The present invention will further be illustrated in greater detail with reference to Examples, but it should be understood that the present invention is not construed as being limited thereto.

EXAMPLE 1

Titanium Oxide Film Formation by CVD

A titanium oxide thin film was formed on a silicon wafer using Compound Nos. 2, 7 and 8 and Comparative Compound 1 by a CVD apparatus shown in FIG. 1 under the following conditions.

Conditions:

Source temperature: 175° C.

Carrier gas: argon (45 sccm)

Oxidizing gas: oxygen (45 sccm)

Reaction pressure: 267 Pa

Reaction temperature: 550° C.

The composition of the thin film thus formed was identified by thin film X-ray diffractometry. The deposition rate was calculated from the film thickness as measured with a contact type film thickness meter and the film forming time. The stability of the CVD material with time was examined from the deposition rates of the 1st and 10th film formation. The results obtained are shown in Table 3 below.

TABLE 3

| CVD Material | Deposition Rate (nm/min) | | Film Composition |
| --- | --- | --- | --- |
| | 1st | 10th | |
| Compara. Compound 1 | 11 | 3.1 | TiO$_2$ |
| Compound No. 2 | 8.8 | 8.2 | TiO$_2$ |
| Compound No. 7 | 12 | 12 | TiO$_2$ |
| Compound No. 8 | 14 | 13 | TiO$_2$ |

EXAMPLE 2

Titanium Oxide Film Formation by CVD

A titanium oxide thin film was formed on a silicon wafer using Compound No. 8 by a CVD apparatus shown in FIG. 1 under the following conditions.

Conditions:

Source temperature: 175° C.

Carrier gas: argon (15, 45 or 75 sccm)

Oxidizing gas: oxygen (15, 45 or 75 sccm)

Reaction pressure: 267 Pa

Reaction temperature: 500° C., 550° C. or 600° C.

The composition of the thin film thus formed was identified by thin film X-ray diffractometry. The deposition rate was calculated from the film thickness as measured with a contact type film thickness meter and the film forming time. The results obtained are shown in Table 4 below.

TABLE 4

| Run No. | Carrier Flow (sccm) | Oxidizing Gas Flow (sccm) | Reaction Temp. (° C.) | Deposition Rate (nm/min) | Film Composition |
| --- | --- | --- | --- | --- | --- |
| 1 | 75 | 75 | 600 | 53 | TiO$_2$ |
| 2 | 45 | 45 | 600 | 39 | TiO$_2$ |
| 3 | 15 | 15 | 550 | 16 | TiO$_2$ |
| 4 | 45 | 45 | 500 | 7.2 | TiO$_2$ |
| 5 | 15 | 15 | 500 | 3.6 | TiO$_2$ |

EXAMPLE 3

Titanium Oxide Film Formation of Solution CVD

Figure 2:
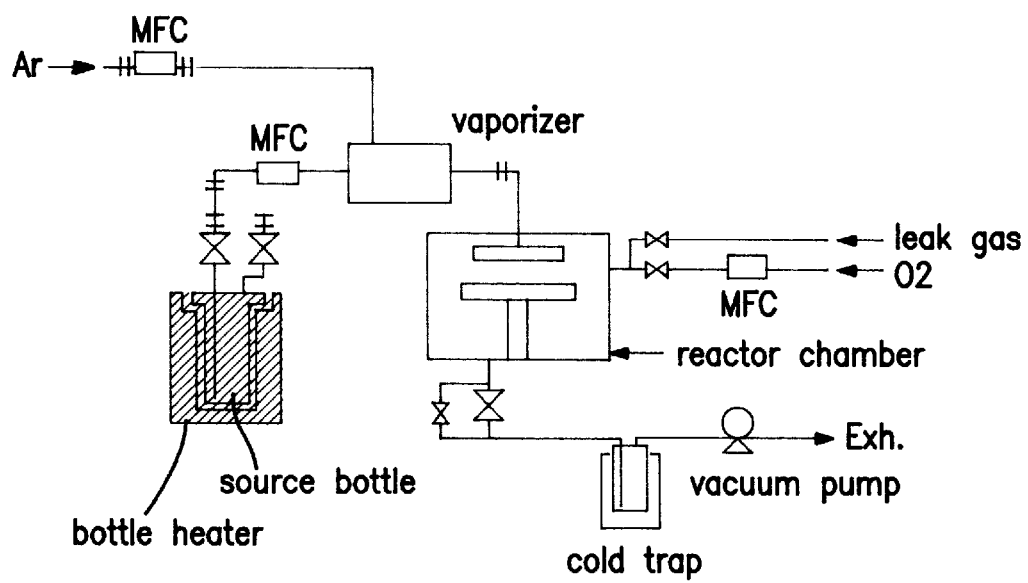
FIG. 2 is a schematic view showing an apparatus for solution CVD system used in Example 3 described below.

A titanium oxide thin film was formed on a silicon wafer using a 0.2 mol/l methanol solution of each of Compound Nos. 2, 7 and 8 by a CVD apparatus shown in FIG. 2 under the following conditions.

Conditions:

Vaporizer temperature: 200° C.

Source flow rate: 0.05 ml/min

Carrier gas: argon (42 sccm)

Oxidizing gas: oxygen (38 sccm)

Reaction pressure: 1000 Pa

Reaction temperature: 550° C.

The composition of the thin film thus formed was identified by thin film X-ray diffractometry. The deposition rate was calculated from the film thickness as measured with a contact type film thickness meter and the film forming time. The results obtained are shown in Table 5 below.

TABLE 5

| Compound No. | Deposition Rate (nm/min) | Film Composition |
| --- | --- | --- |
| 2 | 23 | TiO$_2$ |
| 7 | 27 | TiO$_2$ |
| 8 | 28 | TiO$_2$ |

What is claimed is:

1. A process for forming a metal oxide film by means of a chemical vapor deposition system, which comprises using a complex of a β-diketone compound and a group IV metal glycolate, the complex being represented by formula (I):

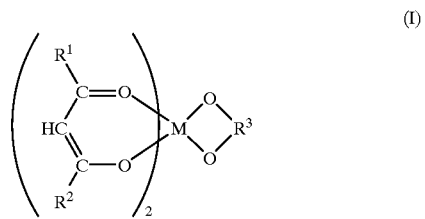

wherein M represents a metal atom of the group IV; $R^1$ and $R^2$ each represent a branched alkyl or cycloalkyl group having 4 to 8 carbon atoms; and $R^3$ represents a straight-chain or branched alkylene group having 2 to 18 carbon atoms.

2. The process according to claim 1, wherein said glycolate is derived from 1,3-propanediol or an alkyl-substituted 1,3-propanediol.

3. The process according to claim 1, wherein said metal atom of the group IV in the formula (I) is titanium.

4. The process according to claim 1, wherein $R^1$ and $R^2$ in the formula (I) is a tert-butyl group.

5. The process according to claim 1, wherein $R^3$ in the formula (I) is —C(CH$_3$)$_2$—CH$_2$—CH(CH$_3$)—.

* * * * *